(12) United States Patent
Tustaniwskyj

(10) Patent No.: US 12,000,884 B2
(45) Date of Patent: Jun. 4, 2024

(54) INTEGRATED CIRCUIT TESTING DEVICE WITH COUPLED CONTROL OF THERMAL SYSTEM

(71) Applicant: Delta Design, Inc., Poway, CA (US)

(72) Inventor: Jerry Ihor Tustaniwskyj, Mission Viejo, CA (US)

(73) Assignee: Delta Design, Inc., Poway, CA (US)

( * ) Notice: Subject to any disclaimer, the term of this patent is extended or adjusted under 35 U.S.C. 154(b) by 105 days.

(21) Appl. No.: 17/566,071

(22) Filed: Dec. 30, 2021

(65) Prior Publication Data

US 2022/0206060 A1 Jun. 30, 2022

Related U.S. Application Data

(60) Provisional application No. 63/132,708, filed on Dec. 31, 2020.

(51) Int. Cl.
*G01R 31/28* (2006.01)
*G01K 1/02* (2021.01)

(52) U.S. Cl.
CPC ......... *G01R 31/2875* (2013.01); *G01K 1/026* (2013.01)

(58) Field of Classification Search
CPC ................ G01K 1/026; G01R 31/2874; G01R 31/2875; G01R 33/20; G01R 33/31; G01R 33/563; G01R 31/2877; G05D 23/1934; G05B 15/02; G06F 17/16
See application file for complete search history.

(56) References Cited

U.S. PATENT DOCUMENTS

| | | | | |
|---|---|---|---|---|
| 9,123,756 B2* | 9/2015 | Schmidt | ............... | H05B 1/0233 |
| 9,702,767 B2* | 7/2017 | Chainer | ............... | G01K 15/005 |
| 9,817,409 B2* | 11/2017 | Murthy | ............... | G05D 23/1917 |
| 9,869,714 B2* | 1/2018 | Johnson | ............ | G01R 31/2874 |
| 10,107,856 B2* | 10/2018 | Appello | ............ | G01R 31/2889 |
| 11,340,288 B1* | 5/2022 | Liao | .................... | G01R 31/2875 |

(Continued)

OTHER PUBLICATIONS

International Search Report and Written Opinion on PCT Appl. Ser. No. PCT/US2021/065671 dated May 23, 2022 (64 pages).

(Continued)

*Primary Examiner* — Vinh P Nguyen
(74) *Attorney, Agent, or Firm* — Knobbe, Martens, Olson & Bear, LLP

(57) ABSTRACT

A system includes a plurality of thermally-coupled zones and a plurality of thermal control devices, each controllable to thermally control one of the plurality of zones, and a plurality of temperature sensors, each configured to measure temperature of one of the plurality of zones. The system includes a control circuit configured to receive a temperature measurement for each of the plurality of zones, collect the temperature measurements in a temperature vector in a real coordinate system, and transform the temperature vector to a normal coordinate system that provides a plurality of uncoupled equations. The control circuit is configured to determine, based on the plurality of uncoupled equations and a desired temperature gradient, a desired power vector in the normal coordinate system, transform the desired power vector to the real coordinate system to generate a power vector, and control the plurality of heaters in accordance with the power vector.

20 Claims, 6 Drawing Sheets

(56) References Cited

U.S. PATENT DOCUMENTS

| | | | |
|---|---|---|---|
| 11,592,299 B2* | 2/2023 | Sørensen | G01C 21/32 |
| 11,796,589 B1* | 10/2023 | Jones | G01R 31/2875 |
| 2013/0105462 A1 | 5/2013 | Schmidt et al. | |
| 2015/0346741 A1 | 12/2015 | Murthy | |

OTHER PUBLICATIONS

Kraus, Alan D. "7.11: The Modal Matrix", Matrices for Engineers, Engineering 360. Sep. 20, 2017. http://www.globalspec.com:80/reference/69714/203279/7-11-the-modal-matrix [accessed Jan. 10, 2024—https://web.archive.org/web/20170920213933/http://www.globalspec.com:80/reference/69714/203279/7-11-the-modal-matrix].

University of Utah, Math Department, "2250 Eigenanalysis." Aug. 19, 2019 math.utah.edu/~gustafso/2250Eigenanalysis.pdf [accessed Dec. 6, 2023].

Weisstein, Eric W. "Eigenvector." MathWorld—A Wolfram Web Resource. Dec. 19, 2019. http://mathworld.wolfram.com/Eigenvector.html [accessed Dec. 6, 2023—https://web.archive.org/web20191219080938/http://mathworld.wolfram.com:80/Eigenvector.html].

* cited by examiner

INTEGRATED CIRCUIT TESTING DEVICE WITH COUPLED CONTROL OF THERMAL SYSTEM

CROSS-REFERENCE TO RELATED APPLICATIONS

This application claims the benefit of and priority to U.S. Provisional Appl. 63/132,708, filed Dec. 31, 2020, the entire disclosure of which is incorporated by reference herein.

TECHNICAL FIELD

The present disclosure relates generally to systems and methods for controlling the temperature of a device, such as a semiconductor electronic device under test.

BACKGROUND

Systems for testing and handling electronic devices, such as packaged integrated circuit chips and unpackaged, bare "chips" or other devices under test (DUT), conventionally may include a temperature control system to maintain the temperature of the electronic device near a constant set point temperature while the device is being tested. Any type of circuitry can be integrated into the DUTs, such as digital logic circuitry or memory circuitry or analog circuitry. Also, the circuitry in the DUT can be comprised of any type of transistors, such as field effect transistors or bi-polar transistors.

It is desirable to keep the temperature of a device constant while it is tested. For example, it is common to test various integrated circuits for failure at certain temperatures. Further, a common practice in the chip industry is to mass produce a particular type of chip, and then speed sort them and sell the faster operating chips at a higher price. CMOS memory chips and CMOS microprocessor chips are processed in this fashion. However, because the speed with which the chip operates may be temperature dependent, the temperature of each chip must be kept nearly constant while the speed test is performed in order to determine the speed of such chips properly.

One challenge in keeping the temperature of a chip or collection of chips constant during testing is minimizing a temperature gradient across the one or more chips being tested. For example, a block (e.g., plate, holder, nest, etc.) may be placed in thermal contact with one or more chips, while the temperature of the block is controlled to attempt to keep the temperature of the one or more chips constant during testing. However, particularly for relatively large blocks, the temperature at one area of the block may become different than at another area of the block. In such a case, the resulting temperature gradient across the block may result in uneven temperatures across the one or more chips being tested, potentially compromising test results. Accordingly, systems and methods for minimizing temperature gradients across one or more chips during testing are needed.

SUMMARY

One implementation of the present disclosure is a system comprising a plurality of thermally-coupled zones. Each of a plurality of thermal control devices is controllable to control the temperature of one of the plurality of thermally-coupled zones. The system also includes a plurality of temperature sensors. Each of the plurality of temperature sensors configured to measure temperature of one of the plurality of thermally-coupled zones. The system also includes a control circuit configured to receive, from the plurality of temperature sensors, a temperature measurement for each of the plurality of thermally-coupled zones, collect the temperature measurements in a temperature vector in a real coordinate system, and transform the temperature vector to a normal coordinate system. The normal coordinate system provides a plurality of uncoupled equations. The control circuit is also configured to determine, based on the plurality of uncoupled equations and a desired temperature gradient across the plurality of thermally-coupled zones, a desired power vector in the normal coordinate system. The control circuit is also configured to transform the desired power vector in the normal coordinate system to the real coordinate system to generate a power vector and control the plurality of heaters in accordance with the power vector to substantially achieve the desired temperature gradient across the plurality of thermally-coupled zones.

DETAILED DESCRIPTION

Referring generally to the drawings, systems and methods for providing temperature control of a thermal system with multiple thermally-coupled zones are shown, according to exemplary embodiments. The systems and methods described herein may be implemented in a variety of testing and handling system for devices, such as integrated circuit devices (e.g., devices under test or DUTs). In such systems, it may be advantageous to substantially maintain the DUTs at a desired temperature during testing. One approach is to place the DUTs in thermal contact with a block or other structure and control the temperature of the block. The DUTs might also be arranged in multiple sockets. In the exemplary systems contemplated herein, the DUTs are positioned relative to each other such that a significant temperature gradient may exist across the DUTs, e.g., a temperature at a first point on the block and a temperature at a second point on the block may be sufficiently different to compromise test results.

The present disclosure introduces the concept that the DUTS are positioned in multiple thermally-coupled zones, where each zone may have a different temperature. As described in detail herein, each zone may be provided with an independently-controllable thermal control device to facilitate better management of the temperature gradient across the block. The thermal control device may include, for example, a heater, although other thermal control devices may be used to heat or cool the one of multiple zones. Because the zones are thermally coupled to one another, the operation of each heater affects the temperature of all of the zones, and, therefore, the amount of heat required from each of the other heaters. In some cases, a fan is provided at each zone to facilitate removal of heat from the zone. Systems and methods for controlling the heaters and/or fans that account for thermal coupling between zones, as described in detail below, may therefore be advantageous in maintaining the block at a desired temperature across multiple zones and/or providing some other desired temperature gradient across the multiple zones.

Figure 1:
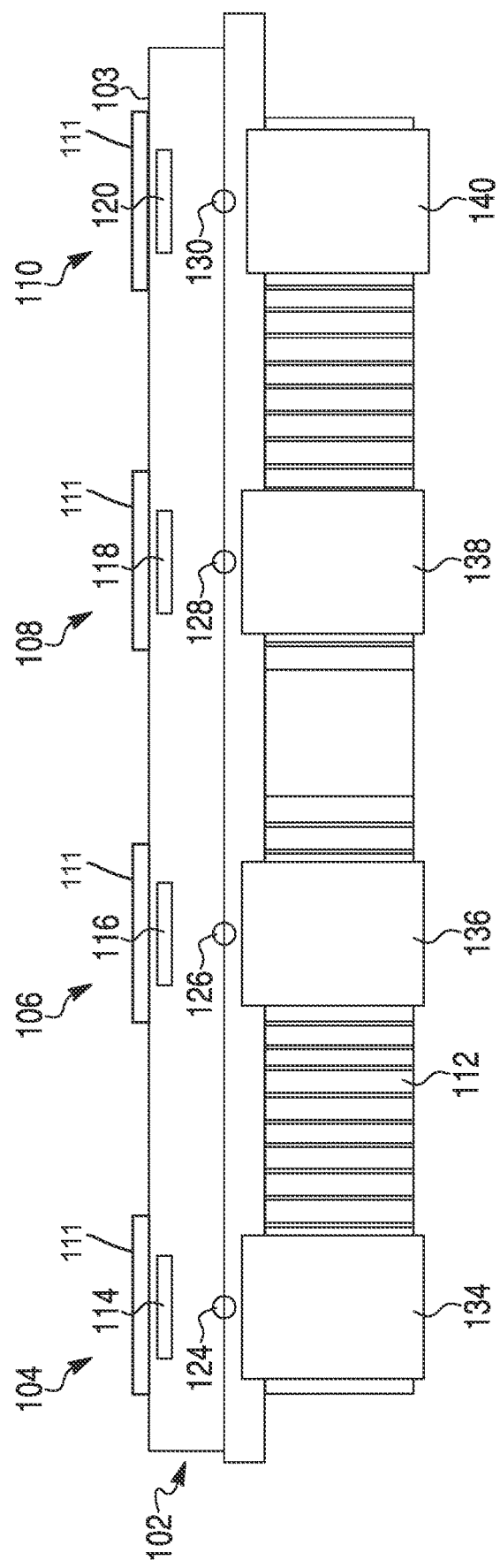
FIG. 1 is an illustration of a coupled thermal system, according to an exemplary embodiment.

Referring now to FIG. 1, a thermal system 100 is shown, according to an exemplary embodiment. The thermal system 100 is shown to include a block 102 having four thermally-coupled zones, namely zone A 104, zone B 106, zone C 108, and zone D 110. It should be understood that the thermal system 100 is one of many possible thermal systems contemplated by the present disclosure and that reference is made to thermal system 100 for the sake of example. For example, in various embodiments, various numbers of zones may be included (e.g., three zones, five zones, six zones, etc.). The block 102 may be made of a conductive metal (e.g., copper) or other suitable thermal material. A top surface 103 of the block 102 may be configured to hold (carry, support, retain) one or more integrated circuit devices (e.g., chips) 111 for testing.

As shown in FIG. 1, the block 102 is coupled to a heat exchanger 112. The heat exchanger 112 may include fins and/or other structure(s) for facilitating heat transfer from the block 102. The heat exchanger 112 may be found at a substantially constant ambient temperature $T_a$. In the embodiments described herein, the ambient temperature $T_a$ is considered to be unaffected by the thermal system 100 (i.e., heat may be transferred from the thermal system 100 to the environment without altering $T_a$).

The thermal system 100 is further shown to include multiple heaters (e.g., four heaters), multiple temperature sensors (e.g., four temperature sensors), and multiple fans (e.g., four fans). Each zone may be aligned with one heater, one temperature sensor, and one fan. In the example shown, zone A 104 includes temperature sensor A 114, heater A 124, and fan A 134; zone B 106 includes temperature sensor B 116, heater B 126, and fan B 136; zone C 108 includes temperature sensor C 118, heater C 128, and fan C 138; and zone D 110 includes temperature sensor D 120, heater D 130, and fan D 140.

Each temperature sensor 114-120 is configured to measure the temperature of the block 102 at the corresponding zone. That is, temperature sensor A 114 measures the temperature at zone A 104 ("$T_A$"), temperature sensor B 116 measures the temperature at zone B 106 ("$T_B$"), temperature sensor C 118 measures the temperature at zone C 108 ("$T_C$"), and temperature sensor D 120 measures the temperature at zone D 110 ("$T_D$"). In some embodiments, the temperature sensors 114-120 include resistance thermal detectors (RTDs). The temperature sensors 114-120 may provide analog and/or digital indications of temperature to a control circuit 200, shown in FIG. 2 and described in detail below. The temperature sensors 114-120 are located at or near a top surface 103 of the block 102, such that the temperature sensor 114-120 measure temperature proximate a position of one or more chips positioned on the block 102 for testing.

Each heater 124-130 is configured to provide heat to the block 102 at the corresponding zone. For example, heater A 124 provides heat to the block 102 at zone A 104. Each heater 124-130 may be operable at variable power to provide a variable amount or rate of heat to the block 102. As described in detail below, the heaters 124-130 are independently controllable, such that each heater A 124 may operate at a different power than heater B 126, heater B 126 may operate at a different power than heater C 128, and so on. The heaters 124-130 may convert electricity into heat through electrical resistance and/or generate heat in some other manner.

Each fan 134-140 is configured to blow air across the block 102 at the corresponding zone to facilitate the transfer of heat out of the block 102 via the heat exchanger 112, for example to draw the temperature of the block 102 towards the ambient air temperature. The fans 134-140 may be independently controllable to operate at various powers (e.g., fan blade speeds, airflow levels, etc.).

Figure 2:
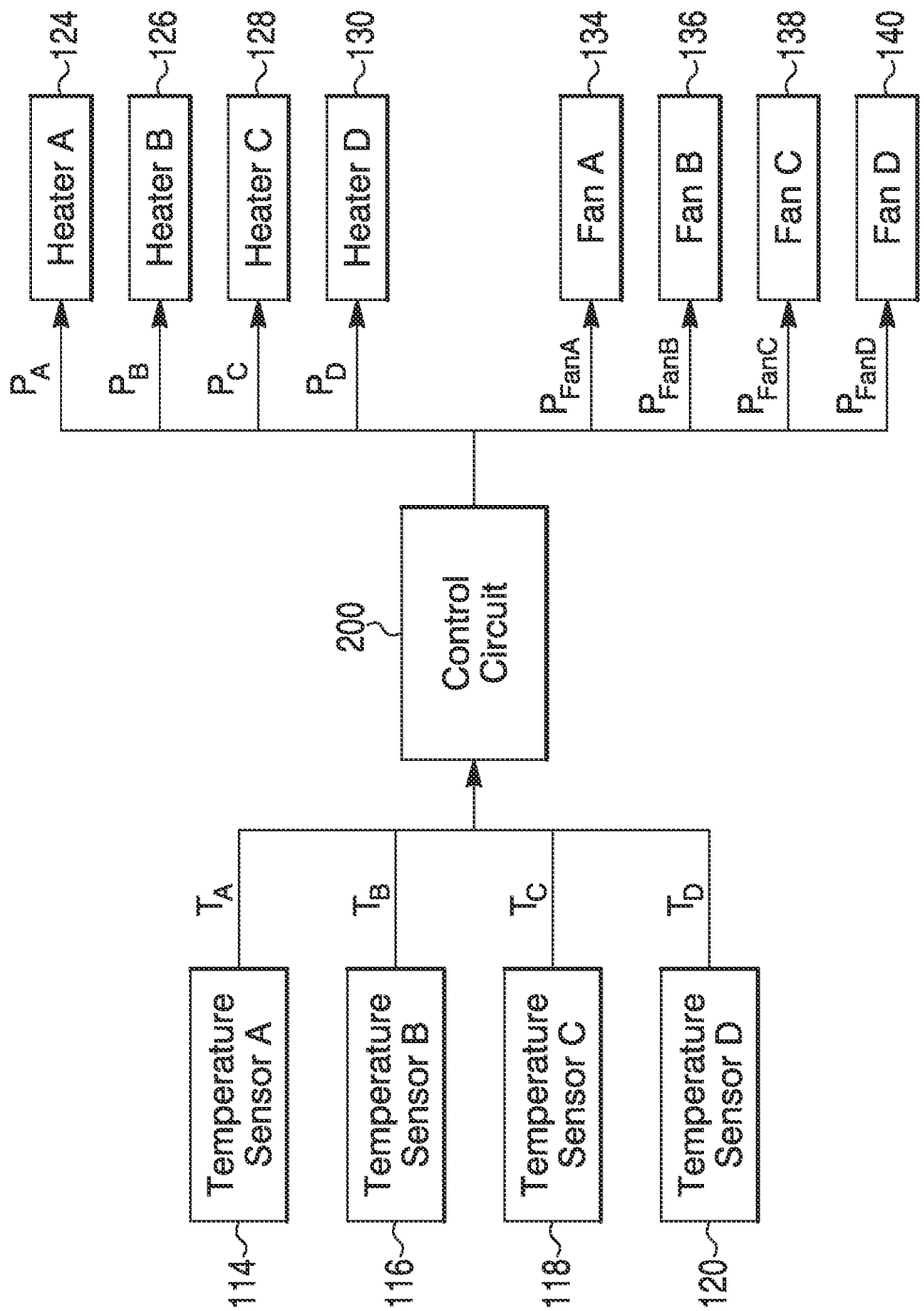
FIG. 2 is a block diagram of a control system for the coupled thermal system of FIG. 1, according to an exemplary embodiment.

Referring now to FIG. 2, a block diagram of the thermal system 100 of FIG. 1 with a control circuit 200 is shown, according to an exemplary embodiment. The control circuit 200 is communicably coupled to the temperature sensor A 114, temperature sensor B 116, temperature sensor C 118, and temperature sensor D 120. In various other embodiments, the control circuit 200 may be communicably coupled to any number of temperature sensors. The control circuit 200 can receive temperature measurements from the temperature sensors. More particularly, in the example shown, the control circuit 200 can receive the temperature $T_A$ at zone A 104 from temperature sensor A 114, the temperature $T_B$ at zone B 106 from temperature sensor B 116, the temperature $T_C$ at zone C 108 from temperature sensor C 118, and the temperature $T_D$ at zone D 110 from the temperature sensor D 120.

The control circuit 200 is configured to control the heaters 124-130 and/or the fans 134-140 based on the temperature measurements $T_A$, $T_B$, $T_C$, $T_D$. In the example shown, the control circuit 200 controls heater A 124 to operate at power $P_A$, heater B 126 to operate at power $P_B$, heater C 128 to operate a power $P_C$, and heater D 130 to operate at power $P_D$. In the example shown, the control circuit 200 may also control fan A 134 to operate at power $P_{FanA}$, fan B 136 to operate at power $P_{Fan\ B}$, fan C 138 to operate at power $P_{FanC}$, and fan D 140 to operate at power $P_{FanD}$. The control circuit 200 may thereby control the amount of heat added and/or removed to each of the thermally-coupled zones 104-110. To determine the values of $\underline{P}=\{P_A, P_B, P_C, P_D, P_{FanA}, P_{Fan\ B}, P_{FanC}, P_{FanD}\}$, the control circuit 200 may follow process 300 shown in FIG. 3 and described in detail with reference thereto below. It should be understood that in various other embodiments (e.g., with a different number of zones), the control circuit 200 may receive various numbers of temperature measurements and output various number of power levels to control various numbers of heaters and/or fans.

The control circuit 200 is configured to generate the power controls $P_i$ based on the temperature measurements $T_i$ to control the temperature and temperature gradient across the thermally-coupled zones to achieve a desired temperature gradient (e.g., zero gradient). In other words, in the formulation contemplated by the present disclosure, the control circuit 200 is configured to manage a dynamically-coupled thermal system that may be approximated by a multi-degree-of-freedom discrete system of order n defined by the system equation $\underline{C}\ \underline{\dot{T}}+\underline{K}\ \underline{T}=\underline{P}$. In this formulation, $\underline{C}$ is the thermal capacity (or thermal mass) matrix with units of J/° C. $\underline{K}$ is the thermal conductivity matrix with units of W/° C. $\underline{P}$ is the power vector with units of W (e.g., a vector of $P_A$ through $P_D$). $\underline{T}$ is the temperature vector (e.g., a vector of $T_A$ through $T_D$). $\underline{\dot{T}}$ is the time-derivative of the temperature vector $\underline{T}$ (i.e., $\underline{\dot{T}}=\delta\underline{T}/\delta t$, where t is time) with units of ° C./s. Under a static analysis (i.e., $\underline{\dot{T}}=0$), the power vector can be calculated based on a given temperature vector as $\underline{K}\ \underline{T}=\underline{P}$.

Inversely, in the static case the temperature can be calculated based on a given power vector as $\underline{T}=\underline{K}^{-1}\underline{P}$.

In this formulation, the vectors (indicated by a single underline) are of length n and the matrices are n-by-n square. The parameter n may be any integer and may equal a count of the number of thermally-coupled zones and/or the number of controllable devices (i.e., heaters and/or fans). For example, in the example thermal system 100 of FIG. 1 having four zones 104-110 and four heaters 114-120, n may be four. In some cases, to account for the four fans 134-140, n may be eight.

In the dynamic, thermally-coupled system managed by the control circuit 200, the thermal coupling between various zones prevents conventional control approaches from being directly applied to the system equation provided above. Accordingly, as described in detail with reference to FIG. 3, the control circuit 200 may generate control signals by transforming from a real coordinate system to a normal coordinate system to generate a set of uncoupled equations in the normal coordinate system, utilize the uncoupled equations to determine control inputs in the normal coordinate system, and convert back into the real coordinate system to determine the power inputs for use in controlling the heaters 124-130 and/or fans 134-140. The following paragraphs provide a derivation of the mathematical basis for this approach.

To address the system equation $\underline{C}\,\dot{\underline{T}}+\underline{K}\,\underline{T}=\underline{P}$, the homogenous equation $\underline{C}\,\dot{\underline{T}}+\underline{K}\,\underline{T}=0$ may be solved using an eigenvalue approach. Assume $\underline{T}=\underline{a}\,e^{-\lambda t}$, which implies $\dot{\underline{T}}=\lambda\underline{T}$ and $[\underline{K}-\lambda\underline{C}]\,\underline{T}=0$. Non-trivial solutions (i.e., $\underline{T}\neq\underline{0}$) require $\det|\underline{K}-\lambda\underline{C}|=0$. There are n solutions, namely eigenvalues $\lambda_i$, i=1, . . . , n. Each eigenvalue $\lambda_i$ has a corresponding eigenvector $\underline{E}_i$ that is scaled such that $\underline{\tilde{E}}_i\underline{C}\underline{E}_i=1$, where $\underline{\tilde{E}}_i$ is the transpose of the vector $\underline{E}_i$. Orthogonality properties provide that $$\underline{\tilde{E}}_i\underline{C}\underline{E}_j = \begin{cases} 1 \text{ if } i=j \\ 0 \text{ if } i \neq j \end{cases}; \text{ and } \underline{\tilde{E}}_i\underline{K}\underline{E}_j = \begin{cases} \lambda_i \text{ if } i=j \\ 0 \text{ if } i \neq j \end{cases}.$$

In a particular case, various methods may be used to find the numerical values of the eigenvalues $\lambda_i$ and eigenvectors $\underline{E}_i$ for a physical thermal system. Using the eigenvectors $\underline{E}_i$, a modal matrix $\underline{V}$ may be defined $\underline{V}=[\underline{E}_1, \underline{E}_2, \ldots, \underline{E}_n]$. $V^T$ denotes the transpose of $\underline{V}$. A vector $\underline{\theta}$ may then be defined as $\underline{T}=\underline{V}\,\underline{\theta}$, where $\underline{\theta}$ is an n-length vector of elements $\theta_i$. $\underline{\theta}$ may be characterized as a representation of the temperature vector $\underline{T}$ in a normal coordinate system (whereas $\underline{T}$ defines temperature values in a real coordinate system). Given these definitions, the system equation $\underline{C}\,\dot{\underline{T}}+\underline{K}\,\underline{T}=\underline{P}$ can be rewritten as $\underline{V}^T\,\underline{C}\,\underline{V}\,\dot{\underline{\theta}}+\underline{V}^T\,\underline{K}\,\underline{V}\,\underline{\theta}=\underline{V}^T\,\underline{P}=\underline{F}$, where $\underline{F}$ is a vector of elements $F_i$ that may be characterized as a representation of the power vector $\underline{P}$ in the normal coordinate system (whereas $\underline{P}$ defines power values in a real coordinate system).

The orthogonality principles above imply that $\underline{V}^T\,\underline{C}\,\underline{V}=\underline{I}$, where $\underline{I}$ is the identity matrix, and $\underline{V}^T\,\underline{K}\,\underline{V}=\underline{\triangle}$, where $\underline{\triangle}$ is a diagonal matrix containing the eigenvalues $\lambda_i$. Accordingly, the system equation $\underline{V}^T\,\underline{C}\,\underline{V}\,\dot{\underline{\theta}}+\underline{V}^T\,\underline{K}\,\underline{V}\,\underline{\theta}=\underline{F}$ can be reduced to $\dot{\underline{\theta}}+\underline{\triangle}\,\underline{\theta}=\underline{F}$, or, equivalently, n uncoupled equations of the form $\dot{\theta}_i+\lambda_i\theta_i=\underline{E}_i^T\,\underline{P}=F_i$. The approach outlined in the preceding paragraphs thereby transforms a coupled system of equations that describes the dynamically-coupled thermal system in a real coordinate system to a collection of uncoupled equations in a normal coordinate system.

In online control, the control circuit 200 may calculate the values of $\theta_i$ from measured (real-coordinate) temperature values $T_i$ based on: $\underline{T}=\underline{V}\,\underline{\theta} \Rightarrow \underline{\theta}=\underline{V}^{-1}\underline{T}=[\underline{V}^T\,\underline{C}]\underline{T}$. One or more of a variety of known control approaches may then be applied using the values of $\theta_i$ to generate values of $F_i$ in the normal coordinate system based on the uncoupled equations $\dot{\theta}_i+\lambda_i\theta_i=F_i$. The control circuit 200 may then convert $F_i$ back to the real coordinate system to determine values of $P_i$ following: $\underline{F}=\underline{V}^T\,\underline{P} \Rightarrow \underline{P}=(\underline{V}^T)^{-1}\underline{F}=[\underline{C}\,\underline{V}]\underline{F}$, which can then be directly used to control the heaters 124-130 and/or fans 134-140.

Figure 3:
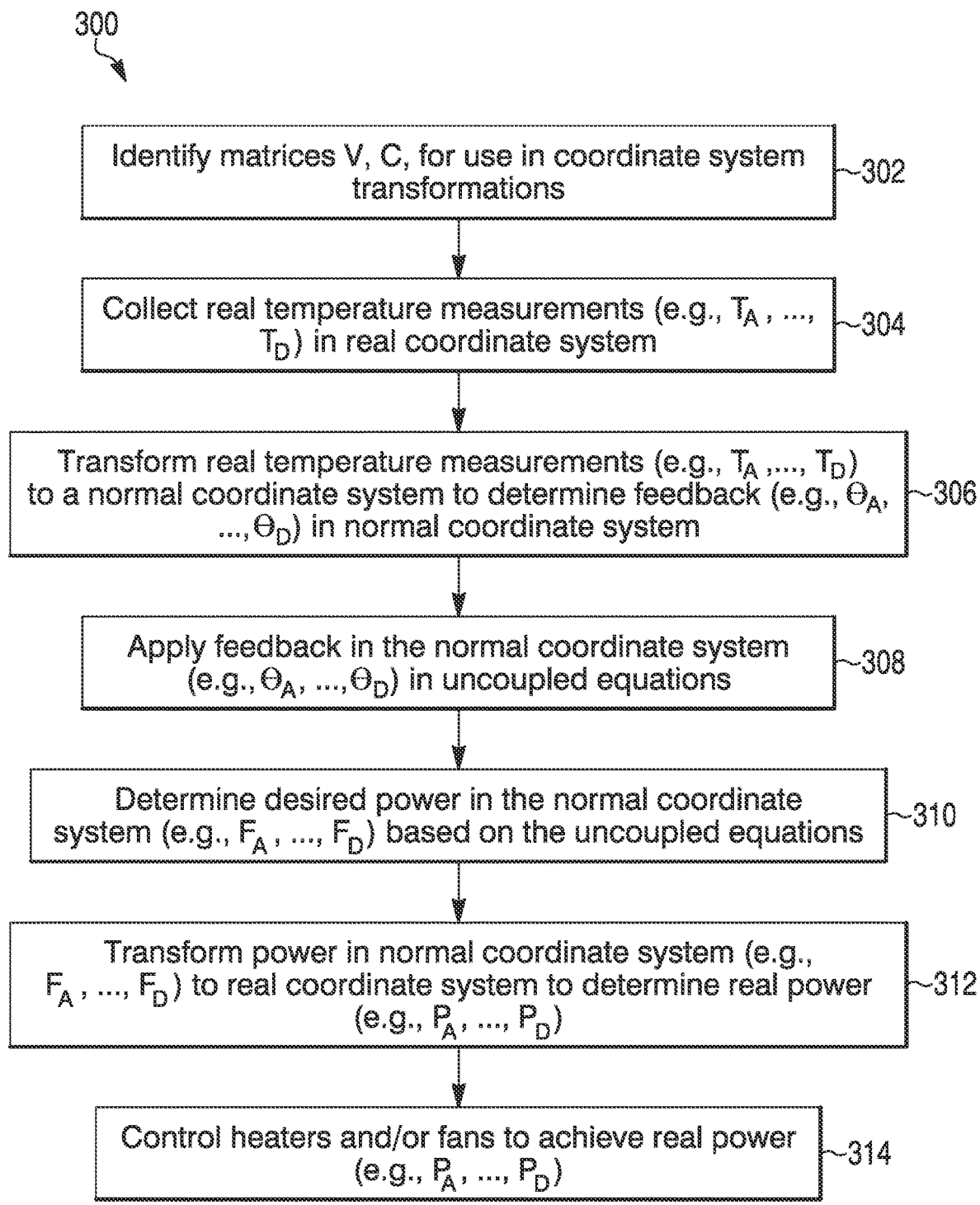
FIG. 3 is a circuit-style diagram of the coupled thermal system of FIG. 1, according to an exemplary embodiment.
Figure 4:
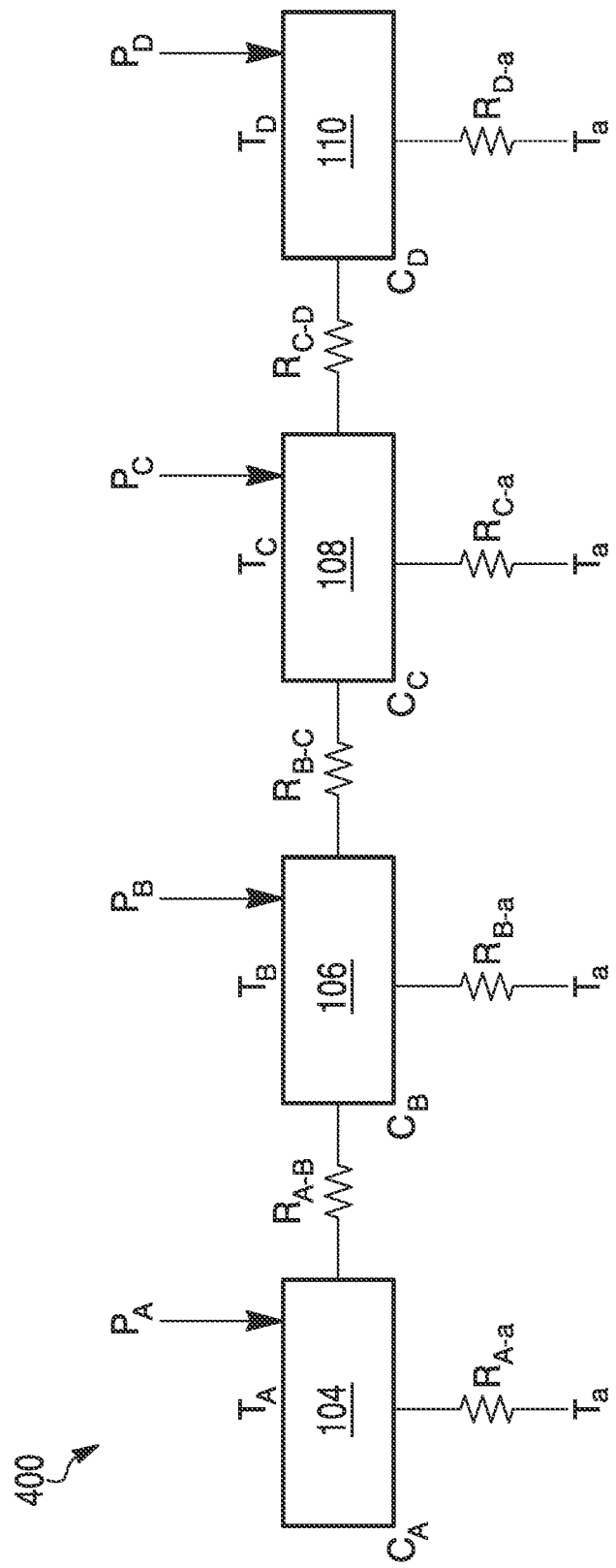
FIG. 4 is a circuit diagram of the coupled thermal system of FIG. 1, according to an exemplary embodiment.
Figure 5:
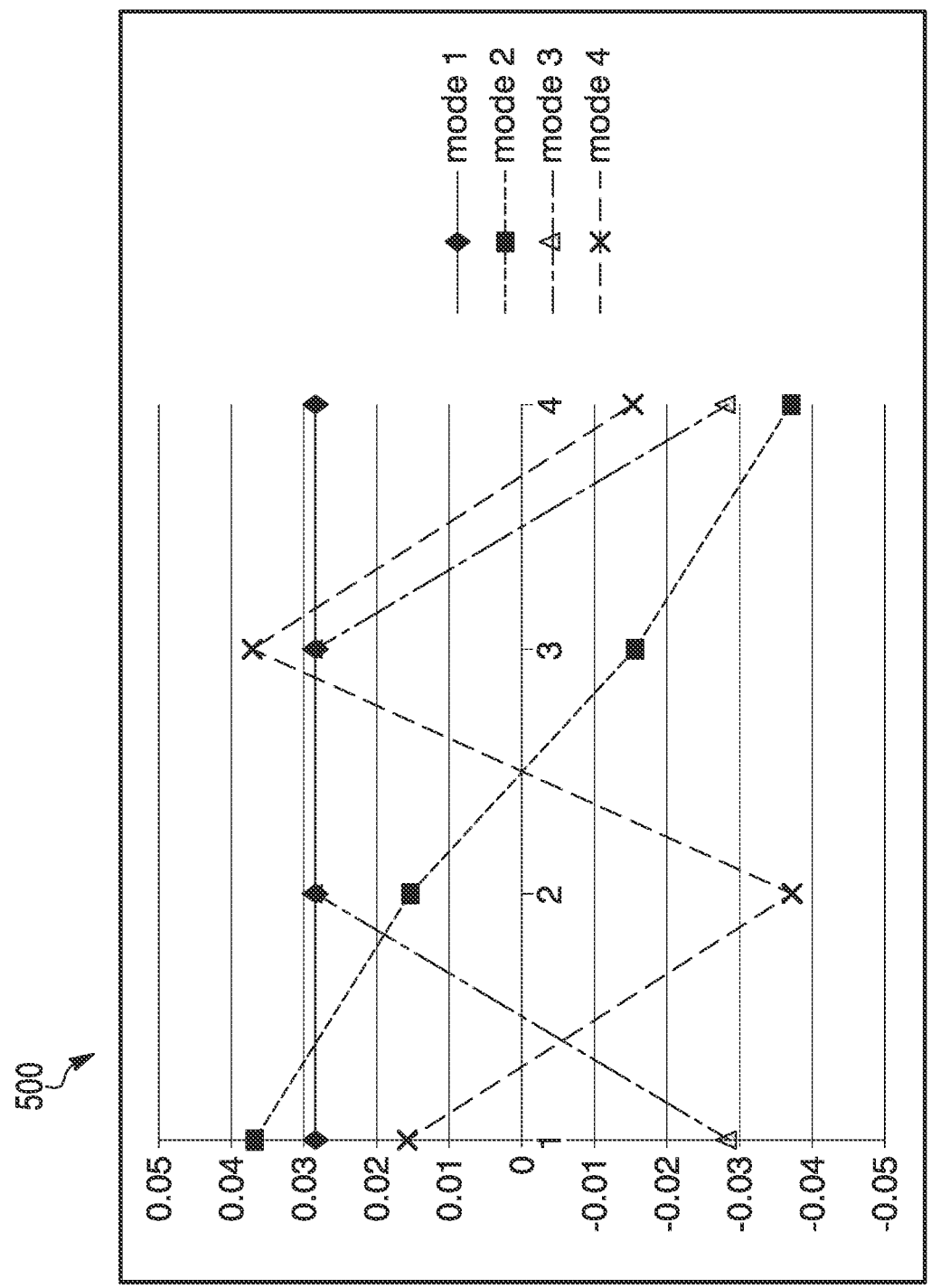
FIG. 5 is a plot of eigenvectors for an asymmetric coupled thermal system, according to an exemplary embodiment.
Figure 6:
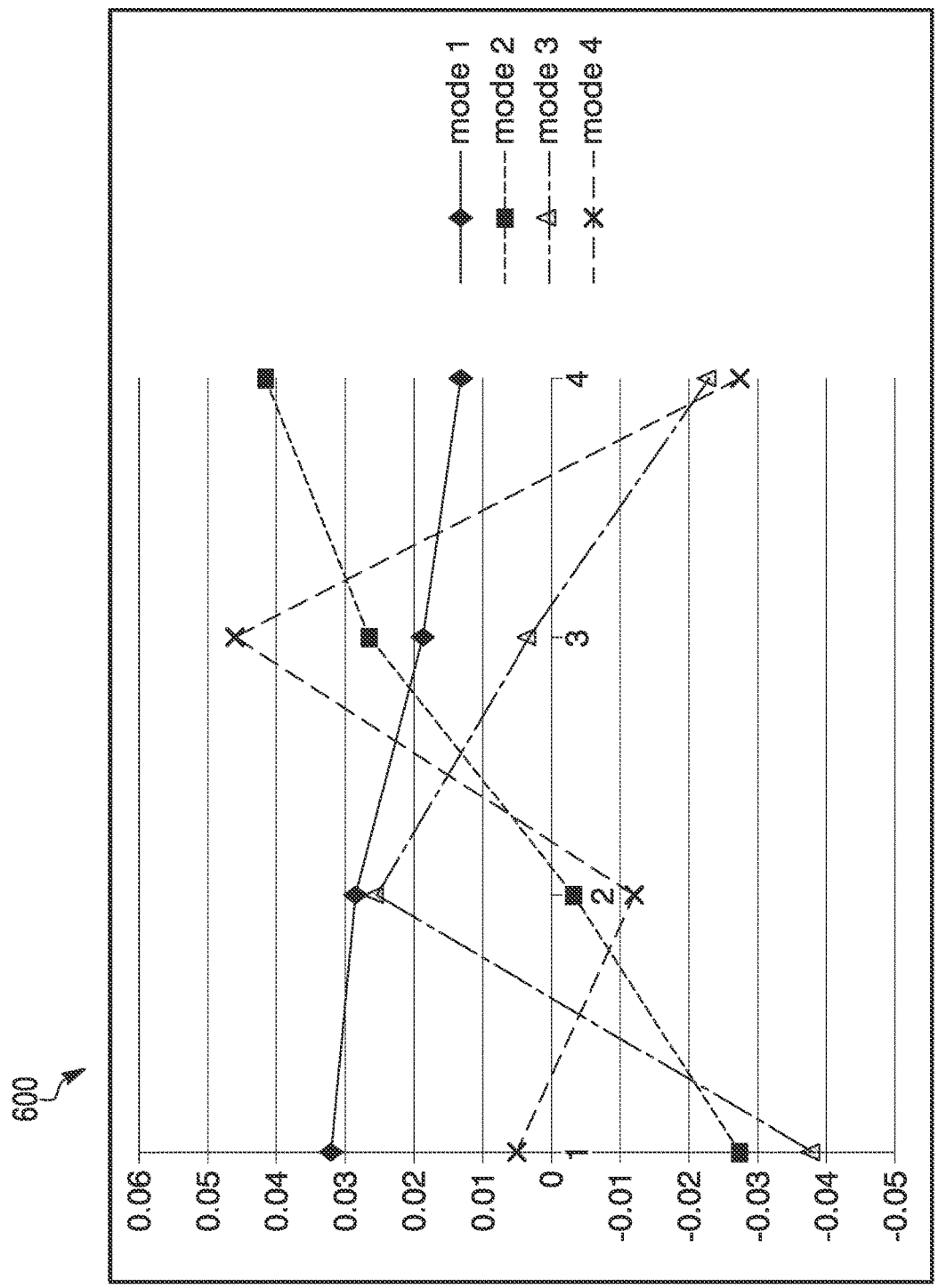
FIG. 6 is a plot of eigenvectors according to an exemplary embodiment.

Referring now to FIG. 3, a flowchart of a process 300 for controlling the heaters 124-130 and/or fans 134-140 is shown, according to an exemplary embodiment. FIGS. 4-6 provide example illustrations useful for describing the process 300, and reference is made thereto in the following discussion. Process 300 can be executed by the control circuit 200 of FIG. 2.

At step 302, the control circuit 200 identifies the matrices $\underline{C}$ and $\underline{V}$ to be used in converting between the real coordinate system and the normal coordinate system. More particularly, as $\underline{\theta}=[\underline{V}^T\,\underline{C}]\underline{T}$ and $\underline{P}=[\underline{C}\,\underline{V}]\underline{F}$, the control circuit 200 may identify numerical values for each element of $[\underline{V}^T\,\underline{C}]$ and $[\underline{C}\,\underline{V}]$ at step 302. In some cases, the values may be automatically derived by the control circuit 200. In other cases, the values may be derived be an engineer and pre-programmed on the control circuit 200.

For example, the values of the elements of matrices $\underline{C}$ and $\underline{V}$ may derived analytically based on a circuit-style diagram, for example diagram 400 of FIG. 4. Diagram 400 of FIG. 4 corresponds to the thermal system 100 of FIG. 1. As shown in diagram 400, zone A 104 is at temperature $T_A$, has thermal capacity $C_A$, and receives power $P_A$. Zone A 104 is shown as thermally coupled to the ambient air (temperature $T_a$) across a resistance $R_{A-a}$, as well as to zone B 106 across a resistance $R_{A-B}$. Zone B 106 is at temperature $T_B$, has thermal capacity $C_B$, and receives power $P_B$. Zone B 106 is shown as thermally coupled to the ambient air (temperature $T_a$) across a resistance $R_{B-a}$, as well as to zone A 104 across a resistance $R_{A-B}$ and zone C 108 across resistance $R_{B-C}$. Zone C 108 is at temperature $T_C$, has thermal capacity $C_C$, and receives power $P_C$. Zone C 108 is shown as thermally coupled to the ambient air (temperature $T_a$) across a resistance $R_{C-a}$, as well as to zone B 106 across a resistance $R_{B-C}$ and zone D 110 across resistance $R_{C-D}$. Zone D 110 is at temperature $T_D$, has thermal capacity $C_D$, and receives power $P_D$. Zone D 104 is shown as thermally coupled to the ambient air (temperature $T_D$) across a resistance $R_{D-a}$, as well as to zone C 108 across a resistance $R_{C-D}$.

From the diagram 400, the thermal capacity and conductivity matrix can be defined as $$\underline{C} = \begin{bmatrix} C_A & 0 & 0 & 0 \\ 0 & C_B & 0 & 0 \\ 0 & 0 & C_C & 0 \\ 0 & 0 & 0 & C_D \end{bmatrix}.$$

In the example of FIG. 4, $$C_A = C_B = C_C = C_D = C_p * \left(\frac{1}{4}\right) * m,$$

where $C_p$ is the specific heat [J/kg] of the material of the block 102 and m is the mass of the block 102.

Furthermore, from the diagram 400 of FIG. 4, the thermal conductivity matrix can be defined as:

$$\underline{K} = \begin{bmatrix} \frac{1}{R_{A-a}} + \frac{1}{R_{A-B}} & -\frac{1}{R_{A-B}} & 0 & 0 \\ -\frac{1}{R_{A-B}} & \frac{1}{R_{A-B}} + \frac{1}{R_{B-C}} + \frac{1}{R_{B-a}} & -\frac{1}{R_{B-C}} & 0 \\ 0 & -\frac{1}{R_{B-C}} & \frac{1}{R_{B-C}} + \frac{1}{R_{C-D}} + \frac{1}{R_{C-a}} & -\frac{1}{R_{C-D}} \\ 0 & 0 & -\frac{1}{R_{C-D}} & \frac{1}{R_{C-D}} + \frac{1}{R_{D-a}} \end{bmatrix}$$

In the example of FIG. 4, $R_{A-a} = R_{B-a} = R_{C-a} = R_{D-a}$ and $$R_{A-B} = R_{B-C} = R_{C-D} = \left(\frac{l}{4}\frac{1}{\text{Area}}\right) * \frac{1}{k},$$

where l is the length of the block 102, Area is the cross-sectional area of the block 102, and k is the thermal conductivity of the block material.

From those definitions based on the diagram 400 of FIG. 4, numerical values can be calculated for each element of the matrices $\underline{C}$ and $\underline{K}$. The matrix $\underline{C}$ may thereby be identified at step 312. To determine the values of the elements of $\underline{V}$, the actual values for $\underline{C}$ and $\underline{K}$ may be plugged into the system equation $\underline{C}\,\underline{\dot{T}} + \underline{K}\,\underline{T} = \underline{P}$. Given a set of example values associated with the diagram 400 of FIG. 4, this may yield:

$$\begin{bmatrix} 308.7 & 0 & 0 & 0 \\ 0 & 308.7 & 0 & 0 \\ 0 & 0 & 308.7 & 0 \\ 0 & 0 & 0 & 308.7 \end{bmatrix} \begin{bmatrix} \dot{T}_A \\ \dot{T}_B \\ \dot{T}_C \\ \dot{T}_D \end{bmatrix} + \begin{bmatrix} 6.76 & -5.76 & 0 & 0 \\ -5.76 & 12.52 & -5.76 & 0 \\ 0 & -5.76 & 12.52 & -5.76 \\ 0 & 0 & -5.76 & 6.76 \end{bmatrix} \begin{bmatrix} T_A \\ T_B \\ T_C \\ T_D \end{bmatrix} = \begin{bmatrix} P_A \\ P_B \\ P_C \\ P_D \end{bmatrix}.$$

From this statement of the system equation, eigenvalues and eigenvectors can be found for use in building the matrix $\underline{V}$ for step 302 of FIG. 3. The eigenvectors are collected as the columns of $\underline{V}$, yielding, for this example, $\underline{V} =$ $$\begin{bmatrix} 0.028458 & 0.037182 & -0.028458 & 0.015402 \\ 0.028458 & 0.015402 & 0.028458 & -0.037182 \\ 0.028458 & -0.015402 & 0.028458 & 0.037182 \\ 0.028458 & -0.037182 & -0.028458 & -0.015402 \end{bmatrix}.$$

These eigenvectors are plotted on graph 500 of FIG. 5. In various alternative examples having various other values for thermal conductivity, thermal capacity, mass, etc. the eigenvalues and eigenvectors have different values. For example, FIG. 6 shows a graph 600 of the eigenvectors for an example in which $$C_A = (0.5) * C_B = C_C = C_D = C_p * \left(\frac{1}{4}\right) * m.$$

In such an example, the increased thermal capacity of zone B 104 creates an asymmetry reflected in the matrix $\underline{V}$ (and visible on the graph 600), but which may not otherwise affect the analysis presented herein.

Still referring to FIG. 3 and step 302 of process 300, the matrices $\underline{C}$ and $\underline{V}$ may thereby be identified for use by the control circuit 200 in online control. In some embodiments, the control circuit 200 directly identifies the matrices $[\underline{V}^T \underline{C}]$ and $[\underline{C}\,\underline{V}]$ at step 302. For the sake of completeness of the foregoing example, in the example laid out above these matrices may be identified as:

$$[\underline{V}^T \underline{C}] = \begin{bmatrix} 8.785 & 8.785 & 8.785 & 8.785 \\ 11.478 & 4.754 & -4.754 & -11.478 \\ -8.785 & 8.785 & 8.785 & -8.785 \\ 4.754 & -11.478 & 11.478 & -4.754 \end{bmatrix}$$

with $[\underline{C}\,\underline{V}]$ equal to the transpose of $[\underline{V}^T \underline{C}]$.

Still referring to FIG. 3, at step 304 the temperature sensors 114-120 collect temperature measurements at each of the zones 104-110 and provide the temperature measurements (e.g., $T_A, \ldots, T_D$) to the control circuit 200. The temperature measurements are received by the control circuit 200 in a real coordinate system, for example in units of degrees Celsius.

At step 306, a vector $\underline{T}$ of the real temperature measurements (in the real coordinate system) is converted to the normal coordinate system to determine the feedback $\theta_i$. That is, $\underline{\theta}$ is calculated as $\underline{\theta} = [\underline{V}^T \underline{C}]\underline{T}$, with $\underline{\theta}$ made up of entries $\theta_i$. This conversion allows the real temperature measurements from the temperature sensors 114-120 to be used as feedback in the normal coordinate system. At step 308, the values $\theta_i$ in the normal coordinate system are applied to uncoupled equations $\dot{\theta}_i + \lambda_i \theta_i = F_i$ to form scalar, first-order differential equations.

At step 310, the uncoupled are equations are used to determine desired values of $F_i$, which may be described as desired power in the normal coordinate system. Various optimizations, control approaches, etc. may be applied in various situations. For example, desired values of $F_i$ may be determined based on a temperature setpoint for the block 102, to minimize a temperature gradient across the block 102 (e.g., to minimize the difference in the temperature measurements $T_A$, $T_B$, $T_C$, $T_D$), and/or to optimize an economic cost of operating the heaters 114-120. The values $F_i$ are collected in the vector $\underline{F}$.

At step 312, the power vector $\underline{F}$ in the normal coordinate system is converted to the real coordinate system to determine a real-coordinate power vector $\underline{P}$. That is, the control circuit 200 calculates $\underline{P}$ as $\underline{P} = [\underline{C}\,\underline{V}]\underline{F}$. The control circuit 200 thereby calculates $\underline{P}$, which is made up of the real-coordinate powers $P_A$ through $P_D$ in the example shown in FIG. 4. At step 314, the control circuit controls the heaters 124-130 and/or fans 134-140 to achieve the power indicated by $\underline{P}$. For example, as shown in FIG. 2, the control circuit 200 may transmit a control signal indicating the power $P_A$ to heater A 124, a control signal indicating the power $P_B$ to heater B 126, a control signal indicating the power $P_C$ to heater C 128, and a control signal indicating the power $P_D$ to heater D 130. The control circuit 200 may thereby overcome the challenges associated with thermal coupling between the zones 104-110.

In some alternative embodiments, an eight-channel control system may be used to provide for control of the four heaters 124-130 as well as the four fans 134-140. In some embodiments, the control of the four fans 134-140 may be assumed to be uncoupled with the feedback for each fan being the heater power, which, in this example, may be measured and provided to the control circuit 200. In such an example, an error signal may be defined as: $\underline{Er}=$ $$\begin{bmatrix} T_{spA} - T_A \\ T_{spB} - T_B \\ T_{spC} - T_C \\ T_{spD} - T_D \\ P_{spA} - P_A \\ P_{spB} - P_B \\ P_{spC} - P_C \\ P_{spD} - P_D \end{bmatrix},$$

where $T_{spi}$ is a temperature setpoint and $P_{spi}$ is a heater power setpoint with (i=A, B, C, D) and the bottom four rows correspond to the control of the fans 134-140. As derived above, converting to the normal coordinate system requires multiplication by $[\underline{V}^T \underline{C}]$ to get $\underline{\theta}=[\underline{V}^T \underline{C}]\underline{Er}$. The matrix $[\underline{V}^T \underline{C}]$ reflects the fact that the bottom four rows are uncoupled. Using the example values calculated in the example above, the eight-channel version of $[\underline{V}^T \underline{C}]$ may be defined as $$[\underline{V}^T \underline{C}] = \begin{bmatrix} 8.785 & 8.785 & 8.785 & 8.785 & 0 & 0 & 0 & 0 \\ 11.478 & 4.754 & -4.754 & -11.478 & 0 & 0 & 0 & 0 \\ -8.785 & 8.785 & 8.785 & -8.785 & 0 & 0 & 0 & 0 \\ 4.754 & -11.478 & 11.478 & -4.754 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

so that the uncoupled (bottom four) elements of $\underline{Er}$ (corresponding to the fans 134-140) are unaffected by the coordinate transformation. Note that $[\underline{C}\,\underline{V}]$ has a similar form, such that the uncoupled elements are also unaffected by the coordinate transformation back to real coordinates under $\underline{P}=[\underline{C}\,\underline{V}]\,\underline{F}$. This is true even where the rows/elements such that the uncoupled degrees of freedom are interspersed among the coupled degrees of freedom (e.g., placed in positions 1, 3, 5, and 7 in $\underline{Er}$).

In other embodiments, the control circuit 200 may use the output of some channels as the input into other channels. For example, in some cases the estimated heater power from one of the channels may be used as feedback for a cooling source such as a fan (e.g., one of fans 134-140), which may allow for minimization of heater output by controlling fan rotation. In such a case, using the $\underline{Er}$ vector defined above, heater outputs from the first four rows may be used as inputs to changes 5, 6, 7, and 8, respectively. The normal coordinates can then be defined as $$\underline{\theta} = [\underline{V}^T \underline{C}]\underline{Er} - [B][\underline{P}], \text{ where } [B] = \begin{bmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \end{bmatrix}.$$

In other cases, the matrix $\underline{B}$ may be used to provide a fixed output (e.g., fixed PWM). In such a case, in the example above the matrix $\underline{B}$ may be defined such that $$[B] = \begin{bmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}.$$

It should be understood that many such variations and formulations are contemplated by the present disclosure to account for various features of the thermal system managed by the control circuit 200 and/or to facilitate optimization of various desired parameters.

Configuration of Exemplary Embodiments

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, calculation steps, processing steps, comparison steps, and decision steps.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

As used herein, the term "control circuit" may include hardware structured to execute the functions described herein. In some embodiments, the "control circuit" may include machine-readable media for configuring the hardware to execute the functions described herein. The control circuit may be embodied as one or more circuitry components including, but not limited to, processing circuitry, network interfaces, peripheral devices, input devices, output devices, sensors, etc. In some embodiments, the control circuit may take the form of one or more analog circuits, electronic circuits (e.g., integrated circuits (IC), discrete circuits, system on a chip (SOCs) circuits, etc.), telecommunication circuits, hybrid circuits, and any other type of "circuit." In this regard, the "control circuit" may include any type of component for accomplishing or facilitating achievement of the operations described herein. For example, a control circuit as described herein may include one or more transistors, logic gates (e.g., NAND, AND, NOR, OR, XOR, NOT, XNOR, etc.), resistors, multiplexers, registers, capacitors, inductors, diodes, wiring, and so on).

The "control circuit" may also include one or more processors communicably coupled to one or more memory or memory devices. In this regard, the one or more processors may execute instructions stored in the memory or may execute instructions otherwise accessible to the one or more processors. In some embodiments, the one or more processors may be embodied in various ways. The one or more processors may be constructed in a manner sufficient to perform at least the operations described herein. In some embodiments, the one or more processors may be shared by multiple circuits (e.g., circuit A and circuit B may comprise or otherwise share the same processor which, in some example embodiments, may execute instructions stored, or otherwise accessed, via different areas of memory). Alternatively or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. Each processor may be implemented as one or more general-purpose processors, application specific integrated circuits (ASICs), field programmable gate arrays (FPGAs), digital signal processors (DSPs), or other suitable electronic data processing components structured to execute instructions provided by memory. The one or more processors may take the form of a single core processor, multi-core processor (e.g., a dual core processor, triple core processor, quad core processor, etc.), microprocessor, etc. In some embodiments, the one or more processors may be external to the apparatus, for example the one or more processors may be a remote processor (e.g., a cloud based processor). Alternatively or additionally, the one or more processors may be internal and/or local to the apparatus. In this regard, a given circuit (control circuit) or components thereof may be disposed locally (e.g., as part of a local server, a local computing system, etc.) or remotely (e.g., as part of a remote server such as a cloud based server). To that end, a "control circuit" as described herein may include components that are distributed across one or more locations. The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. A system comprising:
a plurality of thermal control devices, each of the thermal control devices controllable to control a temperature of one of a plurality of thermally-coupled zones;
a plurality of temperature sensors, each of the temperature sensors configured to measure the temperature of one of the thermally-coupled zones; and
a control circuit configured to:
receive, from the temperature sensors, a temperature measurement for each of the thermally-coupled zones,
collect the temperature measurements in a temperature vector in a real coordinate system,
transform the temperature vector to a normal coordinate system, the normal coordinate system providing a plurality of uncoupled equations, each of the uncoupled equations associated with operation of the thermal control devices,
determine, based on the uncoupled equations and a desired temperature gradient across the thermally-coupled zones, a desired power vector in the normal coordinate system, the desired power vector associated with operation of the thermal control devices,
transform the desired power vector in the normal coordinate system to the real coordinate system to generate a power vector, and
control the thermal control devices in accordance with the power vector to substantially achieve the desired temperature gradient across the thermally-coupled zones.

2. The system of claim 1, wherein the desired temperature gradient is a zero gradient.

3. The system of claim 1, wherein the control circuit is configured to transform the temperature vector to the normal coordinate system by multiplying the temperature vector by a multiple of a transpose of a modal matrix and a thermal capacity matrix, the modal matrix defined using eigenvectors for the system, the thermal capacity matrix defined based on a thermal capacity of each of the thermally-coupled zones.

4. The system of claim 1, wherein the control circuit is configured to transform the desired power vector in the normal coordinate system to the power vector in the real coordinate system by multiplying a multiple of a thermal capacity matrix and a modal matrix by the desired power vector, the modal matrix defined using eigenvectors for the system, the thermal capacity matrix defined based on a thermal capacity of each of the thermally-coupled zones.

5. The system of claim 1, further comprising a plurality of fans, each of the fans configured to provide airflow at one of the thermally-coupled zones; and
wherein the control circuit is configured to control the fans in accordance with the power vector to substantially achieve the desired temperature gradient across the thermally-coupled zones.

6. The system of claim 1, wherein each of the thermal control devices is a heater.

7. The system of claim 1, wherein:
each of the thermal control devices is a heater; and
the desired temperature gradient is a zero gradient.

8. The system of claim 7, wherein the control circuit is configured to transform the temperature vector to the normal coordinate system by multiplying the temperature vector by a multiple of a transpose of a modal matrix and a thermal capacity matrix, the modal matrix defined using eigenvectors for the system, the thermal capacity matrix defined based on a thermal capacity of each of the thermally-coupled zones.

9. The system of claim 7, wherein the control circuit is configured to transform the desired power vector in the normal coordinate system to the power vector in the real coordinate system by multiplying a multiple of a thermal capacity matrix and a modal matrix by the desired power vector.

10. The system of claim 7, further comprising a plurality of fans, each of the fans configured to provide airflow at one of the thermally-coupled zones; and
wherein the control circuit is configured to control the fans in accordance with the power vector to substantially achieve the desired temperature gradient across the thermally-coupled zones.

11. The system of claim 1, wherein:
each of the thermal control devices is a heater; and
the control circuit is configured to transform the temperature vector to the normal coordinate system by multiplying the temperature vector by a multiple of a transpose of a modal matrix and a thermal capacity matrix, the modal matrix defined using eigenvectors for the system, the thermal capacity matrix defined based on a thermal capacity of each of the thermally-coupled zones.

12. The system of claim 11, further comprising a plurality of fans, each of the fans configured to provide airflow at one of the thermally-coupled zones; and
wherein the control circuit is configured to control the fans in accordance with the power vector to substantially achieve the desired temperature gradient across the thermally-coupled zones.

13. The system of claim 1, wherein:
each of the thermal control devices is a heater; and
the control circuit is configured to transform the desired power vector in the normal coordinate system to the power vector in the real coordinate system by multiplying a multiple of a thermal capacity matrix and a modal matrix by the desired power vector, the modal matrix defined using eigenvectors for the system, the thermal capacity matrix defined based on a thermal capacity of each of the thermally-coupled zones.

14. The system of claim 13, further comprising a plurality of fans, each of the fans configured to provide airflow at one of the thermally-coupled zones; and
wherein the control circuit is configured to control the fans in accordance with the power vector to substantially achieve the desired temperature gradient across the thermally-coupled zones.

15. The system of claim 1, further comprising a plurality of fans, each of the fans configured to provide airflow at one of the thermally-coupled zones;
wherein each of the thermal control devices is a heater;
wherein the control circuit is configured to transform the desired power vector in the normal coordinate system to the power vector in the real coordinate system by multiplying a multiple of a thermal capacity matrix and a modal matrix by the desired power vector, the modal matrix defined using eigenvectors for the system, the thermal capacity matrix defined based on a thermal capacity of each of the thermally-coupled zones; and
wherein the control circuit is configured to control the plurality of fans in accordance with the power vector to substantially achieve the desired temperature gradient across the thermally-coupled zones.

16. The system of claim 1, wherein:
the desired temperature gradient is a zero gradient; and
the control circuit is configured to transform the temperature vector to the normal coordinate system by multiplying the temperature vector by a multiple of a transpose of a modal matrix and a thermal capacity matrix, the modal matrix defined using eigenvectors for the system, the thermal capacity matrix defined based on a thermal capacity of each of the thermally-coupled zones.

17. The system of claim 16, further comprising a plurality of fans, each of the fans configured to provide airflow at one of the thermally-coupled zones; and
wherein the control circuit is configured to control the fans in accordance with the power vector to substantially achieve the desired temperature gradient across the thermally-coupled zones.

18. The system of claim 1, further comprising a block having a top surface configured to support one or more integrated circuit devices for testing;
wherein each of the temperature sensors is mounted at the top surface.

19. The system of claim 18, wherein each of the thermal control devices is configured to heat a zone of the block.

20. The system of claim 19, further comprising a fans coupled to the block, each of the fans disposed at the zone heated by one of the thermal control devices.

* * * * *